United States Patent
Fesler et al.

(10) Patent No.: US 10,116,301 B2
(45) Date of Patent: Oct. 30, 2018

(54) CROSS-COUPLED, NARROW PULSE, HIGH VOLTAGE LEVEL SHIFTING CIRCUIT WITH VOLTAGE DOMAIN COMMON MODE REJECTION

(71) Applicant: Infineon Technologies Americas Corp., El Segundo, CA (US)

(72) Inventors: Robert Fesler, Hawthorne, CA (US); Srivastava Aviral, Los Angeles, CA (US)

(73) Assignee: INFINEON TECHNOLOGIES AMERICAS CORP., El Segundo, CA (US)

( * ) Notice: Subject to any disclaimer, the term of this patent is extended or adjusted under 35 U.S.C. 154(b) by 63 days.

(21) Appl. No.: 15/208,297

(22) Filed: Jul. 12, 2016

(65) Prior Publication Data
US 2018/0019749 A1 Jan. 18, 2018

(51) Int. Cl.
*H03K 17/687* (2006.01)
*H03K 19/0185* (2006.01)

(52) U.S. Cl.
CPC ... *H03K 17/687* (2013.01); *H03K 19/018507* (2013.01)

(58) Field of Classification Search
CPC ............. H03K 17/687; H03K 17/6871; H03K 17/6872; H03K 19/0185; H03K 19/018507; H03K 19/018514; H03K 19/018521; H03K 19/018528
USPC ........................ 326/82, 83, 88; 327/108, 109
See application file for complete search history.

(56) References Cited

U.S. PATENT DOCUMENTS

| | | | | |
|---|---|---|---|---|
| 6,646,469 B2 * | 11/2003 | Yushan | ................. | H03K 17/063 326/68 |
| 7,049,850 B2 * | 5/2006 | Shimizu | ................. | H01L 27/088 257/E27.06 |
| 7,679,944 B2 * | 3/2010 | Sakurai | .................... | H02M 1/08 257/361 |
| 8,044,699 B1 * | 10/2011 | Kelly | ............... | H03K 19/01852 327/333 |
| 8,405,422 B2 * | 3/2013 | Akahane | .......... | H03K 19/01852 326/62 |
| 9,444,249 B2 * | 9/2016 | Imanishi | ............... | H02H 7/1227 |
| 9,768,777 B2 * | 9/2017 | Yao | .................. | H03K 19/01752 |
| 2005/0077928 A1 * | 4/2005 | Honda | ....................... | H03F 3/21 327/112 |

(Continued)

OTHER PUBLICATIONS

"Half Bridge Driver," International Rectifier, IR2103(S)PBF, www.irf.com, Apr. 18, 2013, 18 pages.

*Primary Examiner* — William Hernandez
(74) *Attorney, Agent, or Firm* — Slater Matsil, LLP

(57) ABSTRACT

A system for high voltage level shifting includes a level shifting circuit having a high side circuit that receives a mixed signal having a common mode signal and a differential mode signal, and to attenuate the common mode signal in the mixed signal to generate an adjusted signal. The high side circuit generates a high output signal at a high output node in response to the adjusted signal. The system further includes a high side high voltage power transistor having a gate connected to the high output node of the high side circuit. The high side high voltage power transistor configured to provide a high portion of an output signal on a first output node in response to the high output signal.

19 Claims, 8 Drawing Sheets

(56) References Cited

U.S. PATENT DOCUMENTS

2005/0122754 A1\* 6/2005 Nielsen ............... H03K 17/063
  363/132
2009/0256619 A1\* 10/2009 Hsu .................... H03K 17/6877
  327/379

\* cited by examiner

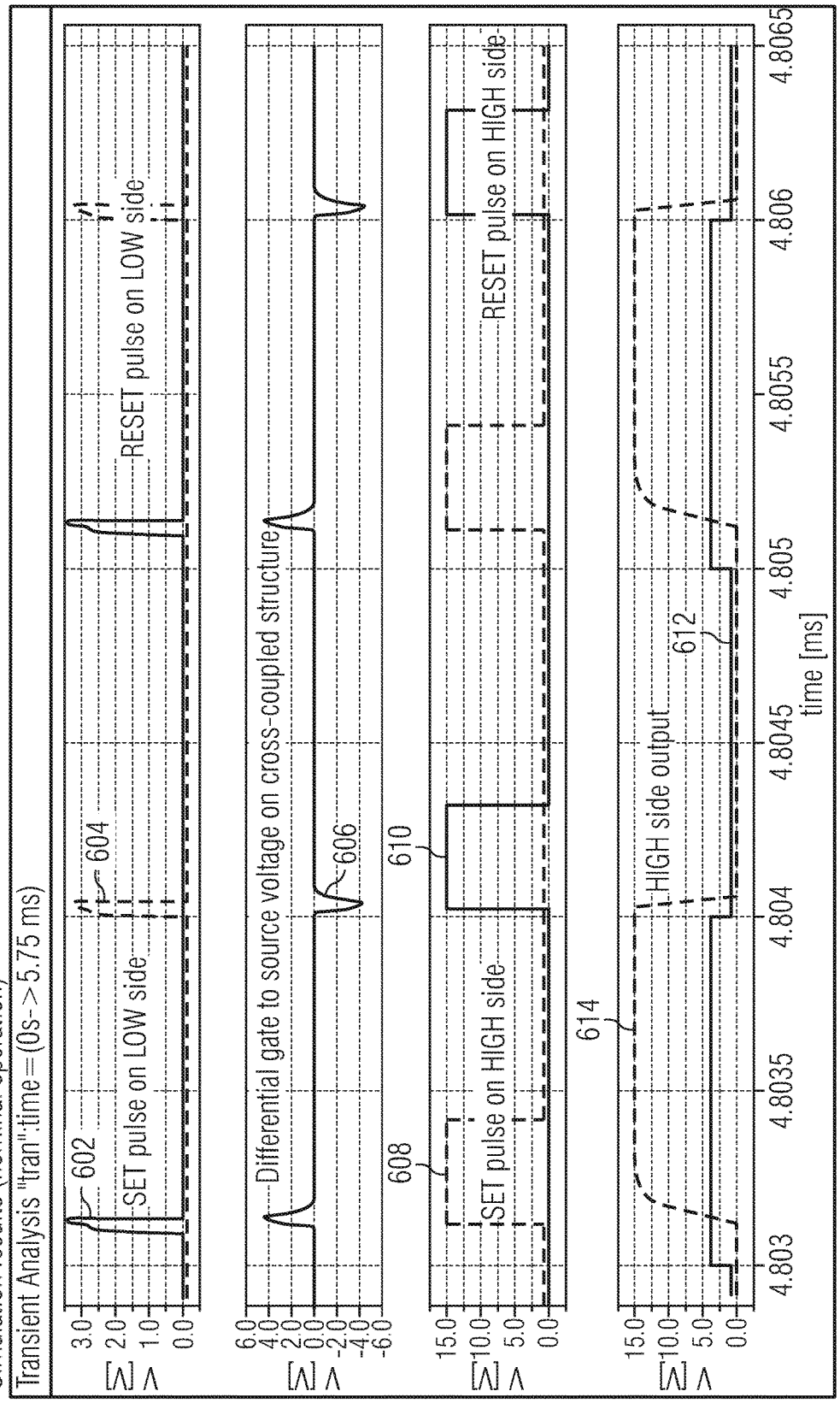

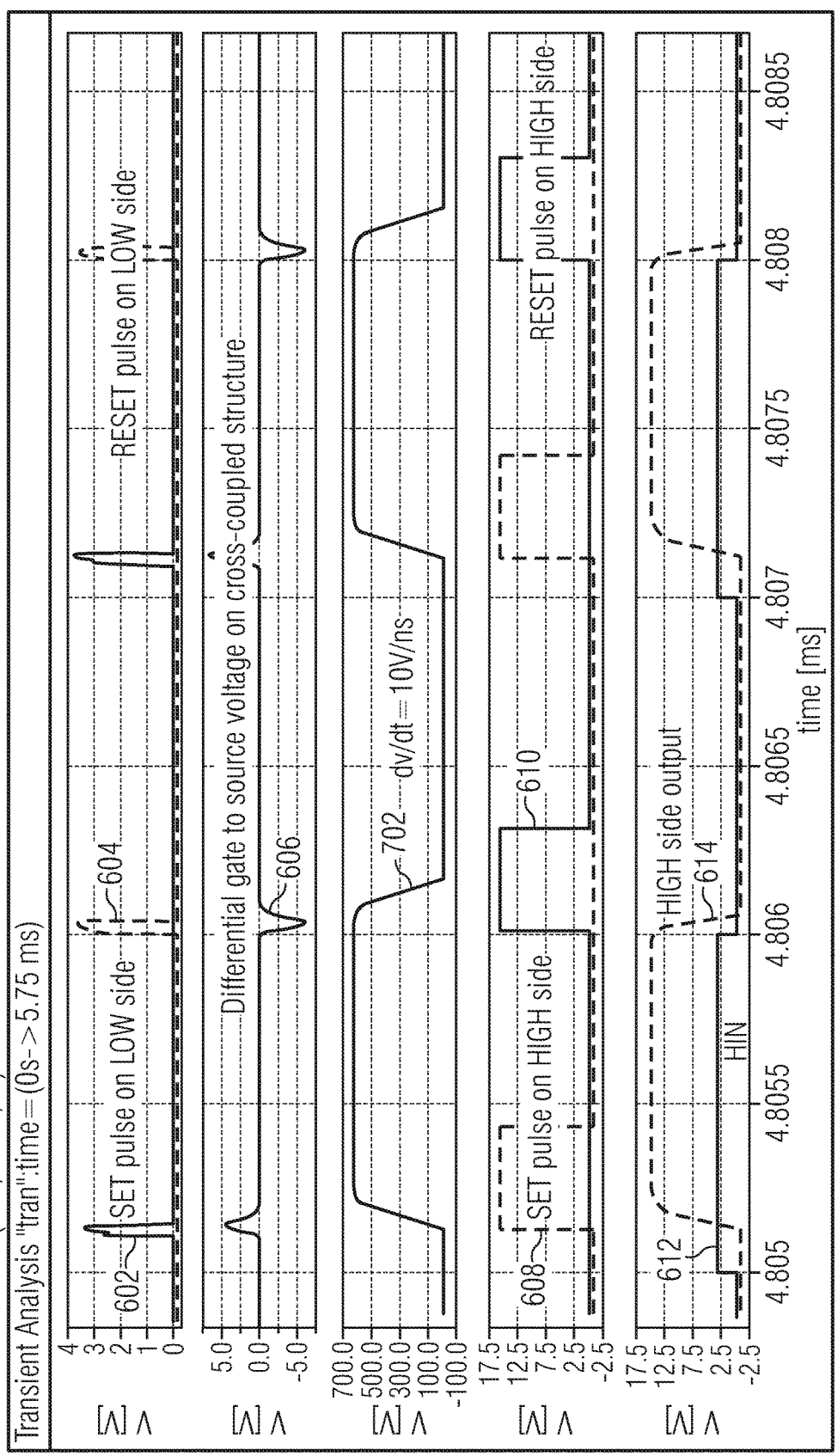

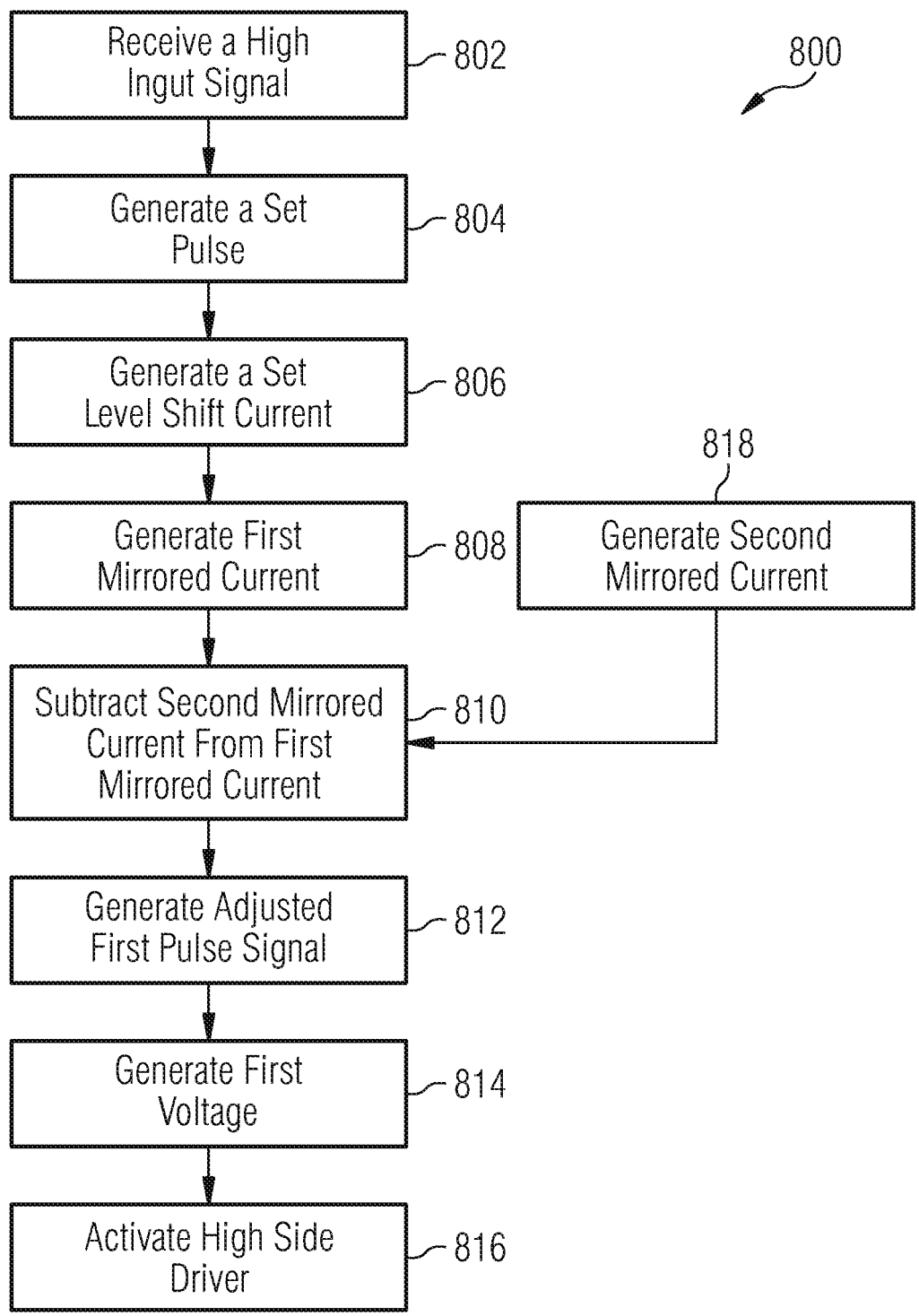

CROSS-COUPLED, NARROW PULSE, HIGH VOLTAGE LEVEL SHIFTING CIRCUIT WITH VOLTAGE DOMAIN COMMON MODE REJECTION

TECHNICAL FIELD

The present invention relates generally to a gate driver system and a method for driving gates of high voltage power transistors, and, in particular embodiments, to a system and method for providing narrow pulse generation with rejection of common mode currents induced by slew in the power supply to a high side driver in a gate driver circuit.

BACKGROUND

High voltage control systems, such as high voltage integrated circuits provide a pulsed direct current output signal that swings from a low voltage, or a ground, to a relatively high voltage compared to the reference voltage. For example, a high voltage control system may have a 600, 800, or 1200 volt difference between the high and low portions of the output signal. In order to provide rapid switching between the high and low portions of the output signal, a high side high voltage power transistor has a gate controlled by a high side gate control circuit, while a low side high voltage power transistor has a gate controlled by a low side gate control circuit. The high side high voltage power transistor provides the high portions of the output signal, while the low side high voltage power transistor provides the low portions of the output signal.

SUMMARY

An embodiment system includes a level shifting circuit having a high side circuit configured to receive a mixed signal having a common mode signal and a differential mode signal, and to attenuate the common mode signal in the mixed signal to generate an adjusted signal. The high side circuit is further configured to generate a high output signal at a high output node in response to the adjusted signal. The system further includes a high side high voltage power transistor having a gate connected to the high output node of the high side circuit. The high side high voltage power transistor configured to provide a high portion of an output signal on a first output node in response to the high output signal. In an embodiment, the system further includes a low side circuit configured to generate the differential signal in response to a high input signal, and low side high voltage power transistor having a gate connected to a low output node of the low side circuit. The low side circuit is further configured to generate a low output signal at the low output node in response to a low input signal, and the low side high voltage power transistor is configured to provide a low portion of an output signal on a second output node in response to the low output signal. In an embodiment, the low side circuit is further configured to generate the differential signal on a first one of a set line and a reset line. The high side circuit comprises a cross coupled current mode cancellation circuit configured to attenuate the common mode signal of the mixed signal through cross coupled subtraction and according to a second signal on a second one of the set line and the reset line. In an embodiment, the system further includes a current mirror configured to generate the first signal by mirroring the mixed signal. In an embodiment, the common mode signal is a slew signal associated with a change in voltage level of a supply voltage of the high side circuit, and the second signal mirrors the slew signal.

An embodiment circuit includes a high side circuit, and the high side circuit includes current mirrors configured to generate mirrored currents that mirror a set signal and a reset signal that are generated in response to a set pulse and a reset pulse and a cross coupled current mode cancellation circuit connected to the current mirrors. The cross coupled current mode cancellation circuit is configured to attenuate at least a portion of a slew current from a first one of the mirrored currents to generate an adjusted first signal, and to generate a first voltage at a resistor according to the adjusted first signal. The high side circuit further includes a high side driver configured to provide a high output signal according to activation to the first voltage. In an embodiment, the circuit further includes a low side circuit having a low side driver configured to receive a high input signal and to generate the set pulse and the reset pulse in response to the high input signal, with the high side circuit isolated from the low side circuit. The high side circuit further includes a cross coupled detector circuit connected to the current mirrors and to the resistor of the cross coupled current mode cancellation circuit, and the high side driver is configured to provide the high output signal according to activation of the high side driver. The cross coupled detector circuit is configured to perform the activation of the high side driver according to the first voltage. In an embodiment, each transistor of the cross coupled detector circuit is an N-channel device, and the slew current is associated with a change in voltage level of at least one supply voltage of the high side circuit. In an embodiment, the first one of the mirrored currents mirrors a first one of the set signal and the reset signal. The cross coupled current mode cancellation circuit is further configured to attenuate the slew current in the first one of the mirrored currents according to a signal at a node complementary to a node carrying the first one of the mirrored currents. In an embodiment, the current mirror mirrors the set signal with a different gain at different mirror transistors, and wherein the current mirror that mirrors the reset signal mirrors the reset signal with a different gain at different mirror transistors.

An embodiment gate driver circuit includes a first current mirror having a first reference current transistor having a source connected to a positive reference voltage port, a first mirror transistor having a source connected to the positive reference voltage port and a gate connected to a gate and a drain of the first reference current transistor, and a second mirror transistor having a source connected to the positive reference voltage port and a gate connected to the gate and the drain of the first reference current transistor. A signalling set transistor is connected in series between the drain of the first reference current transistor and a ground. The gate driver circuit further includes a cross coupled current mode cancellation circuit having a first differential signal detection mirror transistor, a first resistor connected in series with the drain of the second mirror transistor and a negative reference voltage port, and a first common mode cancellation mirror transistor connected in parallel to the first resistor and in series between the drain of the second mirror transistor and the negative reference voltage port, and having a gate connected to a gate and a drain of a second differential signal detection mirror transistor. In an embodiment, the gate driver circuit further includes a pulse generator, with the signalling set transistor having a gate connected to a first port of the pulse generator, and a high side driver having a first port connected to the positive reference voltage port. The gate river circuit further includes a cross coupled N-channel detector including a first cross coupled transistor and a second cross coupled transistor. The first cross coupled transistor is connected in series between the first port of a high side driver and a gate of a second cross coupled transistor, and wherein the first cross coupled transistor a gate connected to a drain of the second mirror transistor and the source of the second cross coupled transistor. In an embodiment, the gate driver circuit further includes a second current mirror having a second reference current transistor having a source connected to the positive reference voltage port, a third mirror transistor having a source connected to the positive reference voltage port and a gate connected to a gate and a drain of the second reference current transistor, and a fourth mirror transistor having a source connected to the positive reference voltage port and a gate connected to the gate and the drain of the second reference current transistor. The gate driver circuit further includes a signalling reset transistor connected in series between the drain of the second reference current transistor and a ground, with the signalling reset transistor having a gate connected to a second port of the pulse generator. The second differential signal detection mirror transistor is connected between the third mirror transistor and the negative reference voltage port. In an embodiment, the gate driver circuit further includes a second resistor connected in series with a drain of the fourth mirror transistor and the negative reference voltage port. The first differential signal detection mirror transistor is connected in series between a drain of the first mirror transistor and the negative reference voltage port, and has a gate connected to the drain of the first mirror transistor and to a gate of a second common mode cancellation mirror transistor. The second common mode cancellation mirror transistor is connected in parallel to the second resistor and in series between the drain of the fourth mirror transistor and the negative reference voltage port, and has a gate connected to a gate and a drain of a second differential signal detection mirror transistor. In an embodiment, the second cross coupled transistor is connected in series between a second port of a high side driver and the gate of the first cross coupled transistor of the cross coupled N-channel detector, and the second port of the high side driver is connected to the positive reference voltage port.

An embodiment method includes generating a set pulse in response to a received high input signal, generating a set signal in response to the set pulse, generating a first mirrored current that mirrors a current of the set signal, and generating a second mirrored current, and subtracting the second mirrored current from the first mirrored current to generate an adjusted first signal. The method further includes generating a first voltage according to the adjusted first signal, and activating a high side driver according to the first voltage, the activating the high side driver causing the high side driver to provide a high output signal. In an embodiment, the method further includes generating the second mirrored current that mirrors a current at a first node that carries a reset signal when generated, and the subtracting the second mirrored current from the first mirrored current includes attenuating the slew current in the first mirrored current to generate the adjusted first signal according to the second mirrored currents. In an embodiment, the attenuating the slew current is performed using a cross coupled current mode cancellation circuit, and the activating the high side driver is performed using a cross coupled detector circuit. In an embodiment, each transistor of the cross coupled detector circuit is an N-channel device. In an embodiment, the attenuating the slew current is performed in response to a change in voltage level of at least one reference voltage of a high side circuit in which the high side driver is disposed.

BRIEF DESCRIPTION OF THE DRAWINGS

For a more complete understanding of the present invention, and the advantages thereof, reference is now made to the following descriptions taken in conjunction with the accompanying drawings, in which:

FIGS. 6 and 7 are charts illustrating simulation results for the operation of a level shifter having an N-channel detector according to some embodiments; and FIG. 8 is a flow diagram illustrating a method for level shifting using common mode rejection according to some embodiments.

DETAILED DESCRIPTION OF ILLUSTRATIVE EMBODIMENTS

Figure 1:
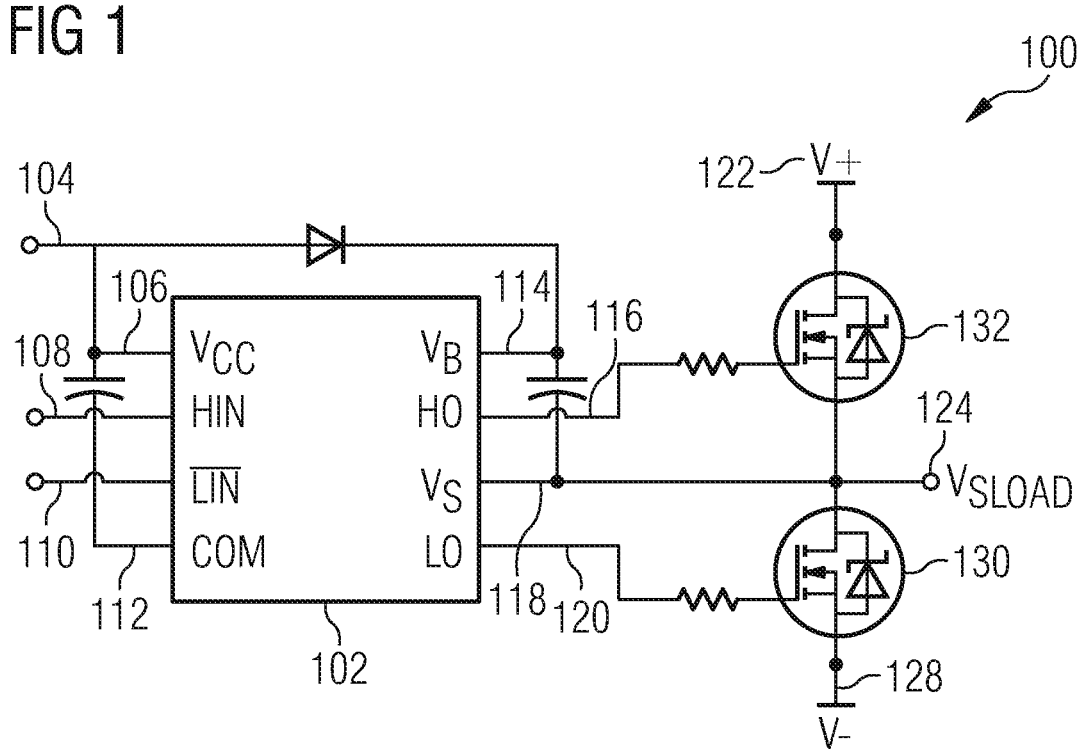
FIG. 1 is a diagram illustrating a high voltage level shifting circuit in a high voltage control system according to some embodiments.

The making and using of embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

High voltage drivers are frequently used to control high voltage power devices by providing the high voltage systems with a pulsed high voltage signal to control, for example, power supplies, audio systems, motors, lighting systems, and the like. High and low side gate control circuits may be a junction isolated high voltage integrated circuit. The high side circuit is disposed in a high side well that is isolated in a die from a low side well having a low side circuit. In some embodiments, the low side circuit and high side circuits may be disposed in a single device, die or chip, but in other embodiments, may be on separate dies or chips, on separate carriers, in separate packages or the like.

To create a high voltage pulsed signal to control high voltage system, a level shifting circuit provides an output signal on two output ports. The high side circuit slews between ground or a reference low voltage and a rectified line voltage in the system. For example, in a high voltage control system that controls a voltage at 600 volts, the high side circuit may slew between a 0 volt ground/reference voltage and a 600 volt maximum rectified voltage. However, such a level shifting methodology is constrained by parasitic capacitance from drain to substrate of high voltage signalling field effect transistors. The slewing by the high side circuit induces a current in the parasitic capacitance that creates a slew current in the signals controlling the high side circuit. Such high side slewing events cause current to flow from drains of high side transistors to the substrate as a result of parasitic capacitance, which interferes with level shift signalling between the high side and the low side. These parasitic capacitances induce a common mode slew current between the low side circuit of the level shifter and the high side circuit so that the signals between the high side and the low side are mixed signals having the differential mode signal and common mode signal. Resistors within the level shifter are linear voltage-to-current converters, thus differential signals between the high side circuit and the low side well in the level shifter appear to ride on the common mode signals created by slew currents and the parasitic capacitances.

It has been determined that rejecting large common mode signals caused by slewing of high side circuit and ensuring transmission of all differential signals avoids the limitations caused by the common mode signal. Common mode signals mask, and masquerade as, differential mode signals. Rejecting the common mode signal, rather than blanking the common mode signal, allows improvements in circuit performance. A system for attenuation or cancellation of common mode signals is described in greater detail below. The common mode signals can be addressed differently than the differential mode signals, permitting the common mode signals to be attenuated or rejected without significantly affecting the differential mode signal. Rejection of common signals reduces or eliminates the need for filters on the signals, and permits the use of more narrow transmission pulses, resulting in lower power dissipation. The improved common mode immunity allows for signal transmission during high side circuit slewing events. The ability to transmit a signal during high side slewing event is a result of the common mode signal attenuation, and propagation of the differential mode signal, avoids the risk of false transmission and eliminated the need for a dV/dt filter. The differential mode signal transmission is unaffected by fast high side slewing event (dV/dt events/transients), for example, 100V/ns transients, and may be tuned based on adjustments to die area and level shifter current. Thus, the frequency of high voltage gate drivers, such as 600v, or higher, gate drivers, is not limited by power dissipation and thermal capability.

FIG. 1 is a diagram illustrating a high voltage level shifting circuit 102 in a high voltage control system 100 according to some embodiments. The level shifter 102 receives a high input signal HIN 108 at a high input port and a low input signal LIN no at a low input port, which indicate to the level shifter 102 when to turn on a high output signal HO 116 or a low output signal LO 120 at an low output node. The high output signal HO 116 controls the gate of a output device such as a high side high voltage power transistor 132 to provide the high portion of the output signal on a output node 124. The high side high voltage power transistor 132 pulls the output node 124 to a positive power supply V$^+$ 122 that may be, for example, a positive D.C. bus voltage, when the high side high voltage power transistor 132 is turned on. Similarly, the low output signal LO 120 controls the gate of an output device such as a low side high voltage power transistor 130 to provide the low portion of the output signal on the output node 124. The low side high voltage transistor 130 pulls the output node 124 to a negative power supply V$^-$ 128 that may be, for example, a negative D.C. bus voltage, when the low side high voltage transistor 130 is turned on. A power input 104 provides a power supply voltage V$_{CC}$ 106 and a common voltage COM 112 for powering circuits in the level shifter 102 that use standard voltage levels. The level shifter 102 uses supply voltages V$_B$ 114 and V$_S$ 118 that, in some embodiments, are a positive bootstrap supply voltage V$_B$ 114 and a negative, floating, or switched node supply voltage V$_S$ 118 received at a positive reference voltage port and a negative reference voltage port, respectively. The supply voltages V$_B$ 114 and V$_S$ 118 power a high side circuit in the level shifter 102. The output node 124 being pulled to the positive power supply V$^+$ 122 causes the positive bootstrap supply voltage V$_B$ 114 and switched node supply voltage V$_S$ 118 to swing between the positive power supply V$^+$ 122 and negative power supply V$^-$ 128, inducing a slew in the connections between the high side circuit and a low side well in the level shifter 102.

Figure 2:
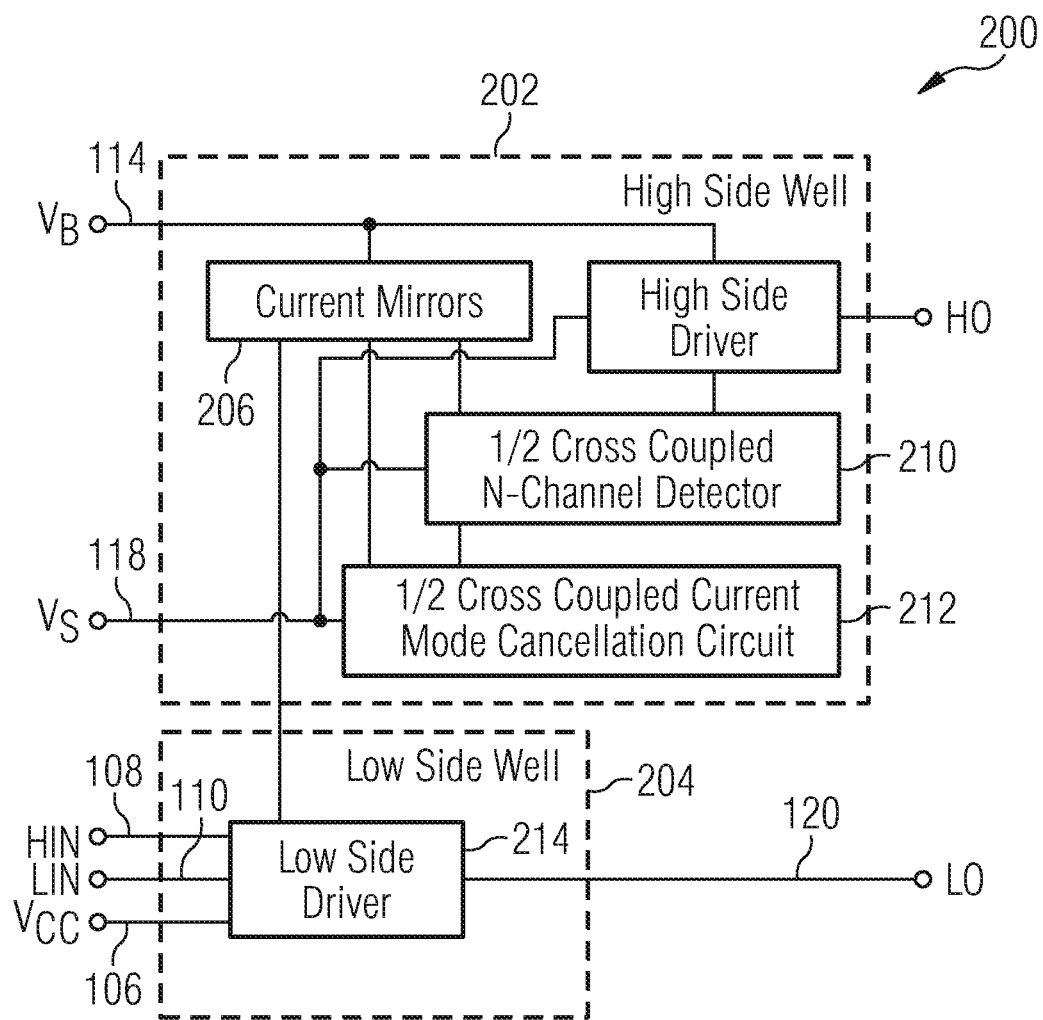
FIG. 2 is a block diagram of a level shifter having an N-channel detector according to some embodiments.

FIG. 2 is a block diagram of a level shifter 200 having an N-channel detector 210 according to some embodiments. A low side circuit 204 has a low side driver circuit 204 that acquires the low input signal LIN no and high input signal HIN 108. The low side driver circuit 204 generates the low output signal LO 120, and provides set and reset signals on set and reset signal lines to the high side circuit 202 indicating when the high side circuit 202 should set the high output signal HO 116 to a high voltage or reset the high output signal HO 116 to a low voltage. Current mirrors 206 in the high side circuit 202 mirror the current of the set and reset signals to a half cross coupled N-channel detector 210 and a half cross coupled current mode cancellation circuit 212. The set and reset signals are differential signals, that is, one signal will be low when the other is high. The slewing of the bootstrap supply voltage V$_B$ 114 and switched node supply voltage V$_S$ 118 induce a common mode slew current or signal in both the set and reset signal lines that carry the set and reset signals. Each half cross coupled current mode cancellation circuit 212 removes or attenuates the common mode signal from the active signal of the set or reset signal to generate an adjusted set or reset signal, and the half cross coupled N-channel detector 210 detects the differential mode signal in the adjusted set and reset signals since the slew current is attenuated in the adjusted set and reset signals. The cross coupled current mode cancellation circuit 212 subtracts the current in the opposing or complementary set or reset line that does not carry the active signal. For example, when a set pulse is sent by the low side driver, the current in the set signal line carries the pulse signal and a slew signal, while the reset signal line carries just the slew current since the reset signal is not active. The half cross coupled current mode cancellation circuit 212 generates an adjusted signal that mirrors the current in the set signal line, with the slew current attenuated based on the slew current detected in the reset signal line.

The adjusted signal is then the differential signal, with the common mode signal removed. The adjusted signal turns on the N-channel detector 210 to turn on or turn off the high side driver 208, which generates the high output signal HO 116 based on the differential signal. Notably, the level shifter 200 having the N-channel detector 210 avoids the use of a dV/dt filter, which reduces the propagation delay. Additionally, removing the common mode signal from the differential signal permits the differential signal to be transmitted during a high-side slewing event, permitting the use of a shorter duration signalling pulse.

Figure 3:
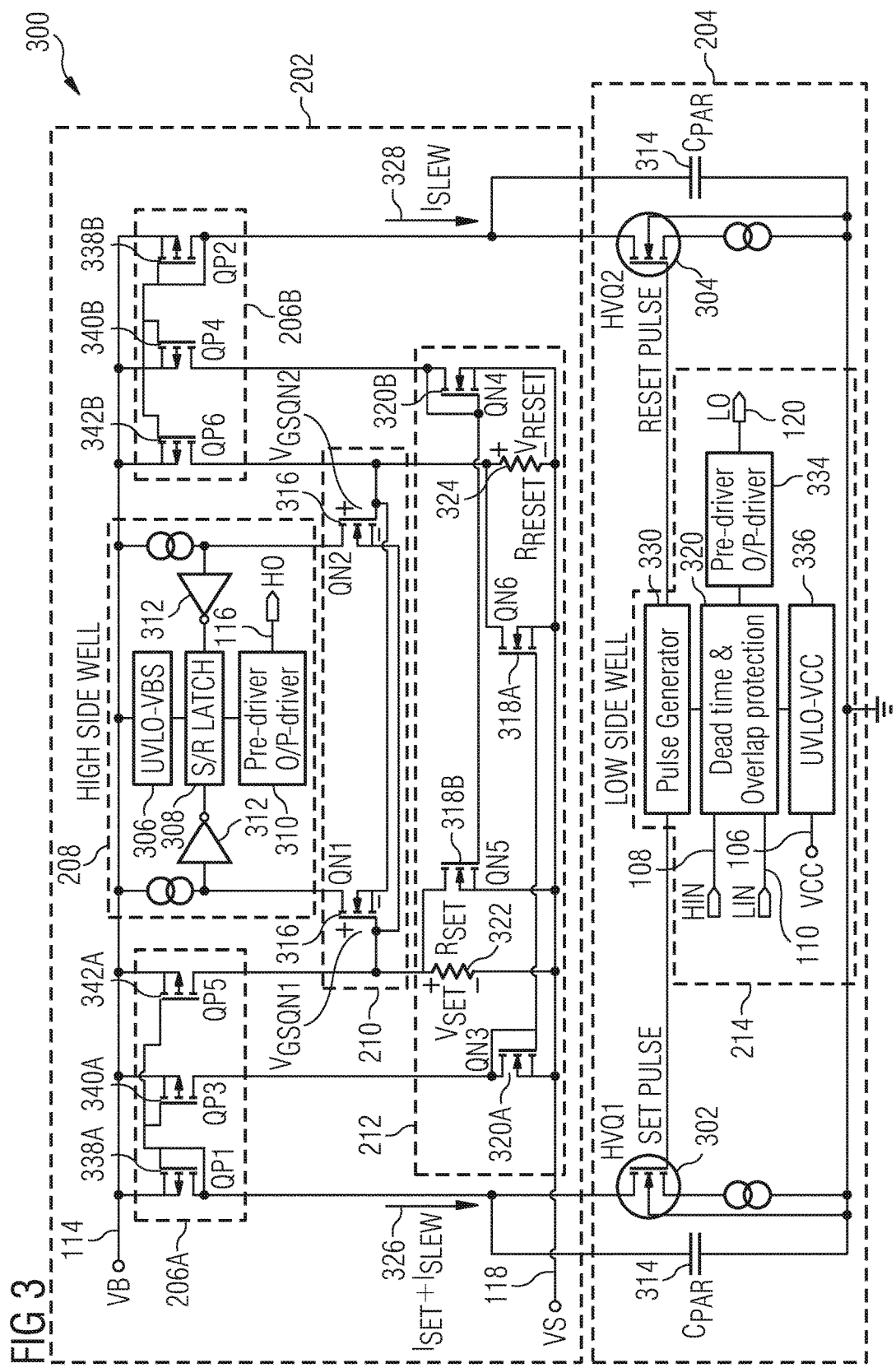
FIG. 3 is a circuit diagram of a level shifter having an N-channel detector according to some embodiments.

FIG. 3 is a circuit diagram of a level shifter 300 having an N-channel detector 210 according to some embodiments. An under voltage lockout circuit (UVLO) 336 receives the power supply voltage V$_{CC}$, provides power to other elements in the low side driver 214, and protects elements in the low side driver 214 by turning off power to the low side driver elements in the event of the power supply voltage dropping below the operational voltage required to run the low side driver 214. A dead time and overlap protection circuit 332 prevents the high side and low side power transistors from being turned on at the same time, avoiding a potentially destructive short circuit. The dead time and overlap protection circuit 332 receives the high input signal HIN 108 and low input signal LIN no and adjusts the timing of those signals to provide the dead time and overlap protection before providing the signals to the pulse generator 330. Additionally, in some embodiments, the dead time and overlap protection circuit 332 provides a signal to a pre-driver/output driver 334 in response to the low input signal LIN 110 being set. The pre-driver/output driver 334 then provides the low output signal LO 120 at a low output port.

The low side circuit 204 has a signalling set transistor 302 and a signalling reset transistor 304 connected to a pulse generator 330 in the low side driver 214. The pulse generator 330 controls the signalling set transistor 302 or the signalling reset transistor 304 in response to the high input signal HIN 108 being set or turned off. The signalling set transistor 302 and signalling reset transistor 304, when turned on, provide a set or reset signal by allowing current to flow to ground from the bootstrap supply voltage $V_B$ through a receiving. The parasitic capacitances $C_{PAR}$ 314 exists in the signalling set transistor 302 and signalling reset transistor 304. These parasitic capacitances $C_{PAR}$ 314 induce a slew current $I_{SLEW}$ in the set signal line 326 and reset signal line 328 through the signalling set and signalling reset transistors 302 and 304 when the high side circuit 202 transitions between low voltage and high voltage states. Therefore, the set and reset signals will have a differential current $I_{SET}$ or $I_{RESET}$ and a common mode current $I_{SLEW}$ during a high side slewing event. FIG. 3 illustrates the differential current $I_{SET}$ and common mode current $I_{SLEW}$ that occurs in the set signal line 326 when the pulse generator turns on the signalling set transistor 302 during a high side slewing event.

Current is mirrored from the bootstrap supply voltage $V_B$ 114 to switched node supply voltage $V_S$ 118 through sensing resistors such as the set resistor $R_{SET}$ 322 and reset resistor $R_{RESET}$ 324. The fractional cross coupled current is subtracted at the set resistor $R_{SET}$ 322 and reset resistor $R_{RESET}$ 324 respectively, providing parallel common mode signal attenuation while differential mode signals are unaffected. This permits propagation of just the differential signal $I_{SET}$ or $I_{RESET}$ through the set resistor $R_{SET}$ 322 and reset resistor $R_{RESET}$ 324, so that the voltage at the gates of the cross coupled transistor 316 is dependent solely on the differential mode current.

In an embodiment, the set signal line 326 and reset signal line 328 are used as reference currents in current mirrors 206A and 206B to generate mirrored currents. The current mirrors 206A and 206B have reference current transistors 338A and 338B connected to first mirror transistors 340A and 340B and second mirror transistors 342A and 342B. In some embodiments, the first mirror transistors 340A and 340B may have a different gain in relation to the reference current transistors 338A and 338B compared to the second mirror transistors 342A and 342B.

The first mirror transistors 340A and 340B mirror the signals on the set signal line 326 and reset signal line 328 to the half cross coupled current mode cancellation circuits 212. Each half cross coupled current mode cancellation circuit 212 has a differential signal detection mirror transistors 320A and 320B connected to respective common mode cancellation mirror transistors 318A and 318B. Differential signal detection mirror transistors 320A and 320B mirror the signals to the respective common mode cancellation mirror transistors 318A and 318B that are in parallel with the set resistor $R_{SET}$ 322 or reset resistor $R_{RESET}$ 324.

The second mirror transistors 342A and 342B mirror the set signal and reset signal to the half N-channel detectors 210. The half N-channel detectors are circuits that each have an N-channel transistor 316, which are cross coupled to each other and that turn on according to the gate-to-source voltage $V_{GS}$. Level shift signals are received across the set resistor $R_{SET}$ 322 and reset resistor $R_{RESET}$ 324.

The common mode cancellation mirror transistors 318A and 318B are in parallel with set and reset resistors 322 and 324, and subtract the slew current from the active signal allowing a current equal to, or proportional to, the slew current to be removed from the signal passing through the resistor 322 or 324, resulting in a voltage across the resistor 322 or 324 that reflects just the set or reset signal current. The cross coupled transistor 316 connected to the first mirror 206A has its gate connected to the set resistor $R_{SET}$ 322 and source connected to the reset resistor $R_{RESET}$ 324 and detects the difference between the combination of differential current $I_{SET}$ and a common mode current $I_{SLEW}$ and just the common mode current $I_{SLEW}$ flowing through the reset resistor $R_{RESET}$ 324 when the set signal is the differential signal. The cross coupled transistor 316 connected to the second mirror 206B has its gate connected to the reset resistor $R_{RESET}$ 324 and source connected to the set resistor $R_{SET}$ 322 and detects the difference between the combination of differential current $I_{SET}$ or $I_{RESET}$ and a common mode current $I_{SLEW}$ and just the common mode current $I_{SLEW}$ 328 flowing through the reset resistor $R_{RESET}$ 324 when the set signal is active.

The cross coupled transistors 316 control the voltage at the high side driver 208. Inverters 312 invert the signal controlled by the cross coupled transistors 316 to set a set/reset latch 308, which outputs a signal to a pre-driver/output driver 310, which, in turn, generates the high output signal HO 116 at a high output port. Additionally, the high side driver has an under voltage lockout circuit (UVLO) that protects elements in the high side driver 208 by turning off power to the low side driver elements in the event of the power supply voltage dropping below the required operational voltage.

The topology described above for the level shifter 300 with the N-channel detector 210 discriminates between differential and common mode signals. Subtracting or attenuating the slew current allows full supply headroom to be utilized without affecting the headroom of the level shift transistors in the high side circuit 202 when the supply voltages $V_B$ 114 and $V_S$ 118 are low.

Figure 4:
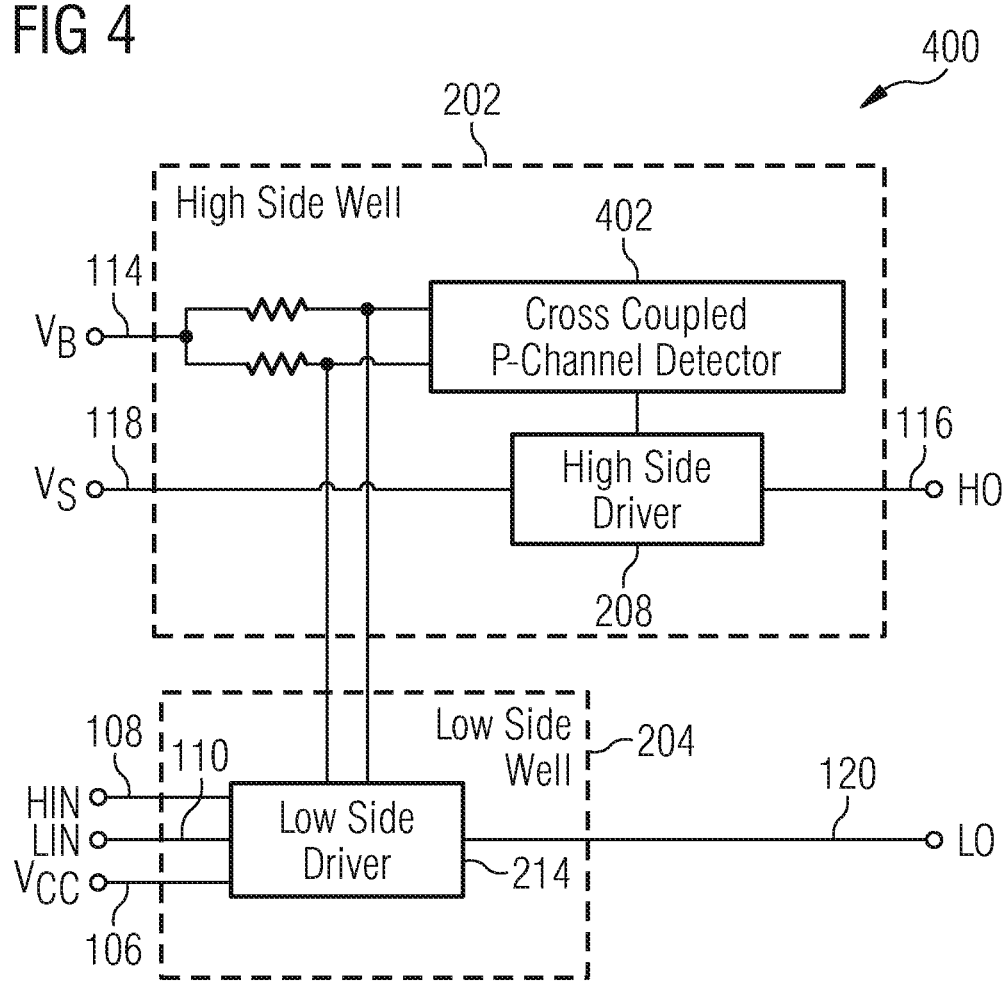
FIG. 4 is a block diagram of a level shifter having a P-channel detector according to some embodiments.

FIG. 4 is a block diagram of a level shifter 400 having a P-channel detector 402 according to some embodiments. The high side circuit 202 of the level shifter 400 has a cross coupled P-channel detector 402 connected between the bootstrap supply voltage $V_B$ 114 and the high side driver 208.

Figure 5:
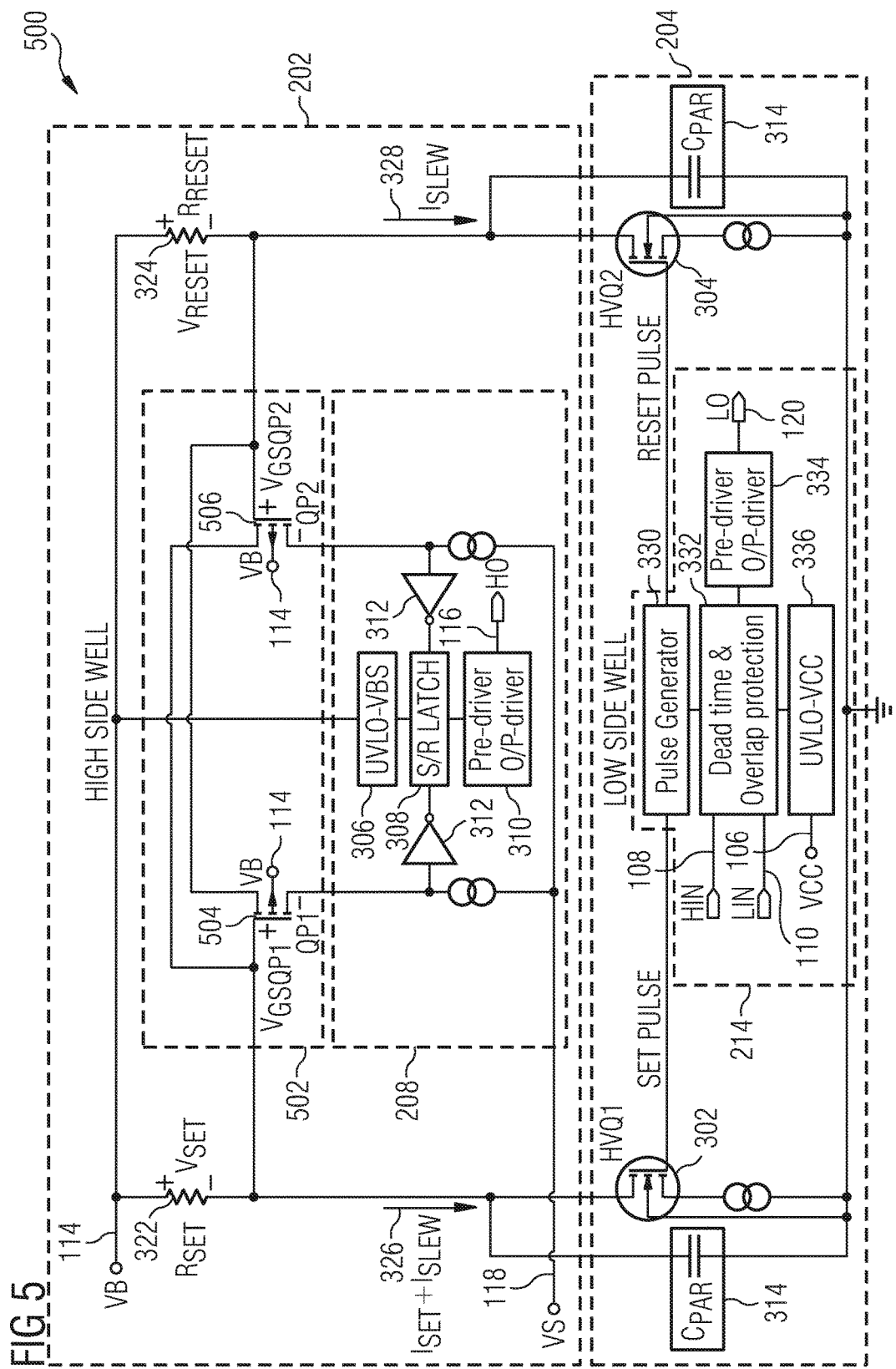
FIG. 5 is a circuit diagram of a level shifter having a P-channel detector according to some embodiments.

FIG. 5 is a circuit diagram of a level shifter 500 having a P-channel detector 502 according to some embodiments. The level shifter 400 has a set resistor $R_{SET}$ 322 and reset resistor $R_{RESET}$ 324 connected to the boostrap supply voltage $V_B$ 114, and the current flowing through the resistors $R_{SET}$ 322 and $R_{RESET}$ 324 is controlled by the signalling set transistor 302 and signalling reset transistor 304. The P-channel detector 502 has cross coupled transistors 316 that are p-channel devices and that have gates controlled by the voltage $V_{SET}$ across the resistors $R_{SET}$ 322 and $R_{RESET}$ 324. The cross coupled transistors 316, when turned on, connect the inverters 312 of the high side driver 208 to ground when the cross coupled transistors 316 are turned on and when the signalling set transistor 302 or the signalling reset transistor 304 are turned, for example, curing a set or reset pulse.

Notably, all signal transmission is limited by headroom constraints. Slewing events cause large voltage swings across resistors, therefore headroom for differential mode signals is reduced to a point where the signal cannot propagate. Additionally, pulse transmission does not occur when the slewing event masks the duration of the pulse width or when the slewing current ($I_{SLEW}$) is larger than the differential mode ($I_{SET}/I_{RESET}$) signal current.

The differential mode signal can be transmitted, under fast slew rates, when the slewing event is shorter than transmission pulse width, and under slow slew rates, when the slewing current amplitude is smaller than the signal current.

FIG. 6 is a chart illustrating simulation results for the nominal operation of a level shifter having an N-channel detector according to some embodiments. The chart illustrates the low side set pulse signal 602 and reset pulse signal 604 in relation to the HIN signal 612, and the resulting high side output HO 614. Additionally, the differential gate-to-source voltage signal 606 ($V_{GSQN1}$) on the cross coupled transistors in the N-channel detector is shown, and the gate voltages are raised to turn on the cross coupled transistors and set/reset the high side driver in response to the set and reset pulse signals 602 and 604. The high side set pulse signal 608 and reset pulse signal 610 further track the high side input HIN signal 612 and low side set and reset pulse signals 602 and 604.

FIG. 7 is a chart illustrating simulation results for the operation of a level shifter having an N-channel detector according to some embodiments during a high side slewing event were the high side slew is 10V/ns (dV/dt). This chart illustrates that the high side output signal HO 614 is largely unaffected by the slew in the high side power supply signal 702. Additionally, the timing and duration of the low side set and reset pulse signals 602 and 604, the differential gate-to-source voltage signal 606 on the cross coupled transistors, and high side set and reset pulse signals 608 and 610 exhibit no meaningful change from the nominal operation.

FIG. 8 is a flow diagram illustrating a method 800 for level shifting using common mode rejection according to some embodiments. In an embodiment, the method includes, in block 802, receiving a high input signal. In block 804, a set pulse is generated in response to the high input signal. In block 806, a set level shift current is generated in response to the set pulse. In block 808, a first mirrored current that mirrors a current of the set signal is generated. In block 818, a second mirrored current that mirrors a current at the inactive set or reset node is generated.

In block 810, the second mirrored current is subtracted from the first mirrored current. In an embodiment, the slew current in the one of the first mirrored currents is attenuated to generate the adjusted first pulse signal according to the second mirrored current. In block 812, an adjusted first pulse signal is generated. In block 814, a first voltage is generated according to the adjusted first pulse signal. In block 816, a high side driver is activated according to the first voltage, and the activating the high side driver causes the high side driver to provide a high output signal.

In some embodiments, the attenuating at least the portion of the slew current is performed using a cross coupled current mode cancellation circuit and the activating the high side driver is performed using a cross coupled detector circuit. In some embodiments, each transistor of the cross coupled detector circuit is an N-channel device. In some embodiments, the slew current is associated with a change in voltage level of at least one supply voltage of the high side circuit.

An embodiment system includes a level shifting circuit having a high side circuit configured to receive a mixed signal having a common mode signal and a differential mode signal, and to attenuate the common mode signal in the mixed signal to generate an adjusted signal. The high side circuit is further configured to generate a high output signal at a high output node in response to the adjusted signal. The system further includes a high side high voltage power transistor having a gate connected to the high output node of the high side circuit. The high side high voltage power transistor configured to provide a high portion of an output signal on a first output node in response to the high output signal. In an embodiment, the system further includes a low side circuit configured to generate the differential signal in response to a high input signal, and low side high voltage power transistor having a gate connected to a low output node of the low side circuit. The low side circuit is further configured to generate a low output signal at the low output node in response to a low input signal, and the low side high voltage power transistor is configured to provide a low portion of an output signal on a second output node in response to the low output signal. In an embodiment, the low side circuit is further configured to generate the differential signal on a first one of a set line and a reset line. The high side circuit comprises a cross coupled current mode cancellation circuit configured to attenuate the common mode signal of the mixed signal through cross coupled subtraction and according to a second signal on a second one of the set line and the reset line. In an embodiment, the system further includes a current mirror configured to generate the first signal by mirroring the mixed signal. In an embodiment, the common mode signal is a slew signal associated with a change in voltage level of a supply voltage of the high side circuit, and the second signal mirrors the slew signal.

An embodiment circuit includes a high side circuit, and the high side circuit includes current mirrors configured to generate mirrored currents that mirror a set signal and a reset signal that are generated in response to a set pulse and a reset pulse and a cross coupled current mode cancellation circuit connected to the current mirrors. The cross coupled current mode cancellation circuit is configured to attenuate at least a portion of a slew current from a first one of the mirrored currents to generate an adjusted first signal, and to generate a first voltage at a resistor according to the adjusted first signal. The high side circuit further includes a high side driver configured to provide a high output signal according to activation to the first voltage. In an embodiment, the circuit further includes a low side circuit having a low side driver configured to receive a high input signal and to generate the set pulse and the reset pulse in response to the high input signal, with the high side circuit isolated from the low side circuit. The high side circuit further includes a cross coupled detector circuit connected to the current mirrors and to the resistor of the cross coupled current mode cancellation circuit, and the high side driver is configured to provide the high output signal according to activation of the high side driver. The cross coupled detector circuit is configured to perform the activation of the high side driver according to the first voltage. In an embodiment, each transistor of the cross coupled detector circuit is an N-channel device, and the slew current is associated with a change in voltage level of at least one supply voltage of the high side circuit. In an embodiment, the first one of the mirrored currents mirrors a first one of the set signal and the reset signal. The cross coupled current mode cancellation circuit is further configured to attenuate the slew current in the first one of the mirrored currents according to a signal at a node complementary to a node carrying the first one of the mirrored currents. In an embodiment, the current mirror mirrors the set signal with a different gain at different mirror transistors, and wherein the current mirror that mirrors the reset signal mirrors the reset signal with a different gain at different mirror transistors.

An embodiment gate driver circuit includes a first current mirror having a first reference current transistor having a source connected to a positive reference voltage port, a first mirror transistor having a source connected to the positive reference voltage port and a gate connected to a gate and a drain of the first reference current transistor, and a second mirror transistor having a source connected to the positive reference voltage port and a gate connected to the gate and the drain of the first reference current transistor. A signalling set transistor is connected in series between the drain of the first reference current transistor and a ground. The gate driver circuit further includes a cross coupled current mode cancellation circuit having a first differential signal detection mirror transistor, a first resistor connected in series with the drain of the second mirror transistor and a negative reference voltage port, and a first common mode cancellation mirror transistor connected in parallel to the first resistor and in series between the drain of the second mirror transistor and the negative reference voltage port, and having a gate connected to a gate and a drain of a second differential signal detection mirror transistor. In an embodiment, the gate driver circuit further includes a pulse generator, with the signalling set transistor having a gate connected to a first port of the pulse generator, and a high side driver having a first port connected to the positive reference voltage port. The gate river circuit further includes a cross coupled N-channel detector including a first cross coupled transistor and a second cross coupled transistor. The first cross coupled transistor is connected in series between the first port of a high side driver and a gate of a second cross coupled transistor, and wherein the first cross coupled transistor has a gate connected to a drain of the second mirror transistor and the source of the second cross coupled transistor. In an embodiment, the gate driver circuit further includes a second current mirror having a second reference current transistor having a source connected to the positive reference voltage port, a third mirror transistor having a source connected to the positive reference voltage port and a gate connected to a gate and a drain of the second reference current transistor, and a fourth mirror transistor having a source connected to the positive reference voltage port and a gate connected to the gate and the drain of the second reference current transistor. The gate driver circuit further includes a signalling reset transistor connected in series between the drain of the second reference current transistor and a ground, with the signalling reset transistor having a gate connected to a second port of the pulse generator. The second differential signal detection mirror transistor is connected between the third mirror transistor and the negative reference voltage port. In an embodiment, the gate driver circuit further includes a second resistor connected in series with a drain of the fourth mirror transistor and the negative reference voltage port. The first differential signal detection mirror transistor is connected in series between a drain of the first mirror transistor and the negative reference voltage port, and has a gate connected to the drain of the first mirror transistor and to a gate of a second common mode cancellation mirror transistor. The second common mode cancellation mirror transistor is connected in parallel to the second resistor and in series between the drain of the fourth mirror transistor and the negative reference voltage port, and has a gate connected to a gate and a drain of a second differential signal detection mirror transistor. In an embodiment, the second cross coupled transistor is connected in series between a second port of a high side driver and the gate of the first cross coupled transistor of the cross coupled N-channel detector, and the second port of the high side driver is connected to the positive reference voltage port.

An embodiment method includes generating a set pulse in response to a received high input signal, generating a set signal in response to the set pulse, generating a first mirrored current that mirrors a current of the set signal, and generating a second mirrored current, and subtracting the second mirrored current from the first mirrored current to generate an adjusted first signal. The method further includes generating a first voltage according to the adjusted first signal, and activating a high side driver according to the first voltage, the activating the high side driver causing the high side driver to provide a high output signal. In an embodiment, the method further includes generating the second mirrored current that mirrors a current at a first node that carries a reset signal when generated, and the subtracting the second mirrored current from the first mirrored current includes attenuating the slew current in the first mirrored current to generate the adjusted first signal according to the second mirrored currents. In an embodiment, the attenuating the slew current is performed using a cross coupled current mode cancellation circuit, and the activating the high side driver is performed using a cross coupled detector circuit. In an embodiment, each transistor of the cross coupled detector circuit is an N-channel device. In an embodiment, the attenuating the slew current is performed in response to a change in voltage level of at least one reference voltage of a high side circuit in which the high side driver is disposed.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A system, comprising:
   a level shifting circuit including:
      a high side circuit configured to receive a mixed signal having a common mode signal and a differential mode signal, and to attenuate the common mode signal in the mixed signal to generate an adjusted signal, wherein the high side circuit is further configured to generate a high output signal at a high output node in response to the adjusted signal;
      a low side circuit configured to generate a differential signal in response to a high input signal and further configured to generate a low output signal at a low output node of the low side circuit in response to a low input signal; and
      a high side high voltage power transistor having a gate connected to the high output node of the high side circuit, the high side high voltage power transistor configured to provide a high portion of an output signal on a first output node in response to the high output signal.

2. The system of claim 1, further comprising:
   a low side high voltage power transistor having a gate connected to low output node of the low side circuit;
   wherein the low side high voltage power transistor is configured to provide a low portion of the output signal on a second output node in response to the low output signal.

3. The system of claim 2, wherein the low side circuit is further configured to generate the differential signal on a first one of a set line and a reset line; and wherein the high side circuit comprises a cross coupled current mode cancellation circuit configured to attenuate the common mode signal of the mixed signal through cross coupled subtraction and according to a second signal on a second one of the set line and the reset line.

4. The system of claim 3, further comprising a current mirror configured to generate a mirrored signal by mirroring the mixed signal.

5. The system of claim 3, wherein the common mode signal is a slew signal associated with a change in voltage level of a supply voltage of the high side circuit, and wherein the second signal mirrors the slew signal.

6. A circuit, comprising:
a high side circuit, including:
current mirrors configured to generate mirrored currents that mirror a set signal and a reset signal that are generated in response to a set pulse and a reset pulse;
a cross coupled current mode cancellation circuit connected to the current mirrors, wherein the cross coupled current mode cancellation circuit is configured to attenuate at least a portion of a slew current from a first one of the mirrored currents to generate an adjusted first signal, and to generate a first voltage at a resistor according to the adjusted first signal; and
a high side driver configured to provide a high output signal according to activation to the first voltage.

7. The circuit of claim 6, further comprising a low side circuit, including a low side driver configured to receive a high input signal and to generate the set pulse and the reset pulse in response to the high input signal, wherein the high side circuit is isolated from the low side circuit;

wherein the high side circuit further includes a cross coupled detector circuit connected to the current mirrors and to the resistor of the cross coupled current mode cancellation circuit;

wherein the high side driver is configured to provide the high output signal according to activation of the high side driver; and wherein the cross coupled detector circuit is configured to perform the activation of the high side driver according to the first voltage.

8. The circuit of claim 7, wherein the cross coupled detector circuit comprises N-channel devices, and wherein the slew current is associated with a change in voltage level of at least one supply voltage of the high side circuit.

9. The circuit of claim 6, wherein the first one of the mirrored currents mirrors a first one of the set signal and the reset signal; and wherein the cross coupled current mode cancellation circuit is further configured to attenuate the slew current in the first one of the mirrored currents according to a signal at a node complementary to a node carrying the first one of the mirrored currents.

10. The circuit of claim 6, wherein a current mirror of the current mirrors that mirrors the set signal mirrors the set signal with a different gain at different mirror transistors, and wherein the current mirror that mirrors the reset signal mirrors the reset signal with a different gain at different mirror transistors.

11. A gate driver circuit, comprising:
a first current mirror including:

a first reference current transistor having a source connected to a positive reference voltage port;
a first mirror transistor having a source connected to the positive reference voltage port and a gate connected to a gate and a drain of the first reference current transistor; and
a second mirror transistor having a source connected to the positive reference voltage port and a gate connected to the gate and the drain of the first reference current transistor;
a signaling set transistor connected in series between the drain of the first reference current transistor and a ground; and
a cross coupled current mode cancellation circuit including:
a first differential signal detection mirror transistor;
a first resistor connected in series with the drain of the second mirror transistor and a negative reference voltage port; and
a first common mode cancellation mirror transistor connected in parallel to the first resistor and in series between the drain of the second mirror transistor and the negative reference voltage port, and having a gate connected to a gate and a drain of a second differential signal detection mirror transistor.

12. The gate driver circuit of claim 11, further comprising:
a pulse generator, wherein the signaling set transistor has a gate connected to a first port of the pulse generator;
a high side driver having a first port connected to the positive reference voltage port; and
a cross coupled N-channel detector including a first cross coupled transistor and a second cross coupled transistor, wherein the first cross coupled transistor is connected in series between the first port of the high side driver and a gate of the second cross coupled transistor, and wherein the first cross coupled transistor has a gate connected to a drain of the second mirror transistor and the source of the second cross coupled transistor.

13. The gate driver circuit of claim 12, further comprising:
a second current mirror, including:
a second reference current transistor having a source connected to the positive reference voltage port;
a third mirror transistor having a source connected to the positive reference voltage port and a gate connected to a gate and a drain of the second reference current transistor; and
a fourth mirror transistor having a source connected to the positive reference voltage port and a gate connected to the gate and the drain of the second reference current transistor; and
a signaling reset transistor connected in series between the drain of the second reference current transistor and a ground, the signaling reset transistor having a gate connected to a second port of the pulse generator;
wherein the second differential signal detection mirror transistor is connected between the third mirror transistor and the negative reference voltage port.

14. The gate driver circuit of claim 13, further comprising:
a second resistor connected in series with a drain of the fourth mirror transistor and the negative reference voltage port;
wherein the first differential signal detection mirror transistor is connected in series between a drain of the first mirror transistor and the negative reference voltage port, and having a gate connected to the drain of the first mirror transistor and to a gate of a second common mode cancellation mirror transistor; and wherein the second common mode cancellation mirror transistor is connected in parallel to the second resistor and in series between the drain of the fourth mirror transistor and the negative reference voltage port, and having a gate connected to a gate and a drain of the second differential signal detection mirror transistor.

15. The gate driver circuit of claim 14, wherein the second cross coupled transistor is connected in series between a second port of a high side driver and the gate of the first cross coupled transistor of the cross coupled N-channel detector; and wherein the second port of the high side driver is connected to the positive reference voltage port.

16. A method, comprising:

generating a set pulse in response to a received high input signal;

generating a set signal in response to the set pulse;

generating a first mirrored current that mirrors a current of the set signal;

generating a second mirrored current that mirrors a current at a first node that carries a reset signal when generated;

subtracting the second mirrored current from the first mirrored current to generate an adjusted first signal, the subtracting comprising attenuating a slew current in the first mirrored current to generate the adjusted first signal according to the second mirrored current;

generating a first voltage according to the adjusted first signal; and activating a high side driver according to the first voltage and using a cross coupled detector circuit, the activating the high side driver causing the high side driver to provide a high output signal.

17. The method of claim 16, wherein the attenuating the slew current is performed using a cross coupled current mode cancellation circuit.

18. The method of claim 17, wherein the cross coupled detector circuit comprises one or more N-channel devices.

19. The method of claim 16, wherein the attenuating the slew current is performed in response to a change in voltage level of at least one reference voltage of a high side circuit in which the high side driver is disposed.

* * * * *